United States Patent
Kim et al.

(10) Patent No.: US 7,776,702 B2
(45) Date of Patent: Aug. 17, 2010

(54) METHOD OF FABRICATING HIGH INTEGRATED SEMICONDUCTOR APPARATUS, AND SEMICONDUCTOR APPARATUS FABRICATED THEREBY

(75) Inventors: Suk Min Kim, Suwon-si (KR); Seong Hwan Kim, Seoul (KR)

(73) Assignee: Hynix Semiconductor Inc, Icheon-Si (KR)

( * ) Notice: Subject to any disclaimer, the term of this patent is extended or adjusted under 35 U.S.C. 154(b) by 0 days.

(21) Appl. No.: 12/495,711

(22) Filed: Jun. 30, 2009

(65) Prior Publication Data

US 2010/0159663 A1   Jun. 24, 2010

(51) Int. Cl.
H01L 21/336    (2006.01)
H01L 21/3205   (2006.01)
H01L 21/4763   (2006.01)

(52) U.S. Cl. .............. 438/302; 438/585; 257/E21.495
(58) Field of Classification Search .......... 438/585, 438/287, 270, 261, 302; 257/E21.79, E21.495, 257/E21.409, E21.423
See application file for complete search history.

(56) References Cited

U.S. PATENT DOCUMENTS

| | | | |
|---|---|---|---|
| 2009/0207667 A1* | 8/2009 | Park et al. | 365/185.33 |
| 2009/0242945 A1* | 10/2009 | Cho et al. | 257/288 |
| 2009/0242972 A1* | 10/2009 | Cho | 257/329 |
| 2009/0256194 A1* | 10/2009 | Kim et al. | 257/330 |
| 2009/0275185 A1* | 11/2009 | Shea et al. | 438/381 |
| 2009/0275187 A1* | 11/2009 | Kiehlbauch et al. | 438/399 |
| 2009/0291551 A1* | 11/2009 | Cho | 438/585 |
| 2010/0025758 A1* | 2/2010 | Cho | 257/329 |
| 2010/0041204 A1* | 2/2010 | Kiehlbauch et al. | 438/397 |
| 2010/0044776 A1* | 2/2010 | Ishiduki et al. | 257/324 |

* cited by examiner

Primary Examiner—Walter L Lindsay, Jr.

(57) ABSTRACT

The present invention provides a method of fabricating a semiconductor apparatus including a vertical transistor and a semiconductor apparatus fabricated thereby which protect a pillar-shaped channel region to stabilize an operating characteristic of the semiconductor apparatus. The method of fabricating the semiconductor apparatus according to the present invention comprises: forming a pillar-shaped pattern on a semiconductor substrate; depositing a conductive layer surrounding the pattern; changing a feature of some portion of the conductive layer through an ion implanting process to form an oxide film; and removing the oxide film using an etching selectivity difference.

15 Claims, 7 Drawing Sheets

METHOD OF FABRICATING HIGH INTEGRATED SEMICONDUCTOR APPARATUS, AND SEMICONDUCTOR APPARATUS FABRICATED THEREBY

CROSS-REFERENCE TO RELATED APPLICATION

The present application claims priority to Korean patent application No. 10-2008-00132463 filed on Dec. 23, 2008, which is incorporated by reference in its entirety.

BACKGROUND OF THE INVENTION

The present invention relates to a method of fabricating a highly integrated semiconductor apparatus, and more particularly, to a fabricating method which can improve integration, operating characteristics and semiconductor chip yield.

In general, a semiconductor is a material belonging to an intermediate region between a conductor and insulator. Although the semiconductor is similar to the insulator in a pure state, its electrical conductivity can be increased by the addition of impurities or other manipulation. The impurity is added to the semiconductor and a conductor is connected thereto to generate a semiconductor device such as a transistor. An apparatus with various functions fabricated using the semiconductor device is a semiconductor apparatus. A representative example of the semiconductor apparatus is a semiconductor memory apparatus.

The semiconductor memory apparatus includes a plurality of unit cells, each of which is composed of a capacitor and a transistor. The capacitor is used to store data. The transistor is used to transfer data between a bit line and the capacitor, corresponding to a control signal (word line). The transistor is composed of three regions, i.e. a gate, source and drain. A control signal input to the gate causes electric charges to move between the source and the drain. The movement of the electric charges occurs through a channel region. This channel uses the properties of the semiconductor to conduct a current.

In a case where a general transistor is formed on a semiconductor substrate, a gate is formed on the semiconductor substrate, and an impurity is doped into both sides of the gate to form a source and a drain. In this case, a space between the source and the drain below the gate becomes a channel region of the transistor. The transistor having this horizontal channel region occupies a certain area of semiconductor substrate. In the case of a complicated semiconductor memory apparatus, it is difficult to reduce the overall area due to a plurality of transistors included therein.

If the total area of the semiconductor memory apparatus is reduced, the number of the semiconductor memory apparatuses that can be produced per wafer can be increased, which leads to higher productivity. A variety of methods have been suggested to reduce the entire area of the semiconductor memory apparatus. One of the methods is to use a vertical transistor having a vertical channel region, instead of using the conventional horizontal transistor having the horizontal channel region.

BRIEF SUMMARY OF THE INVENTION

Various embodiments of the invention are directed to providing a method of fabricating a semiconductor apparatus including a vertical transistor and a semiconductor apparatus fabricated thereby which protect a pillar-shaped channel region by changing film quality of a conductive layer through an ion implanting process in forming a gate and selectively removing the same through wet etch, to thereby stabilize an operating characteristic of the semiconductor apparatus.

According to an embodiment of the present invention, a method of fabricating a semiconductor apparatus comprises: forming a pillar-shaped pattern on a semiconductor substrate; depositing a conductive layer surrounding the pattern; changing a feature of some portion of the conductive layer through an ion implanting process to form an oxide film; and removing the oxide film using an etching selectivity difference.

Preferably, the method of fabricating the semiconductor apparatus further comprises implanting an impurity into the semiconductor substrate exposed between the patterns to form a bit line, after removing the oxide film.

Preferably, the method of fabricating the semiconductor apparatus further comprises depositing an oxide film on the pattern and the conductive layer, prior to forming the bit line.

Preferably, forming the pillar-shaped pattern on the semiconductor substrate comprises: depositing a pad oxide film on the semiconductor substrate; depositing a hard mask film on the pad oxide film; patterning the hard mask film through an exposure process; and etching the pad oxide film and some portion of the semiconductor substrate, using the patterned hard mask film.

Preferably, a gate oxide film is formed between the pattern and the conductive layer.

Preferably, the ion implanting process comprises: a first ion implanting process for implanting oxygen ions vertically; and a second ion implanting process for implanting the oxygen ions, rotating with a certain gradient.

Preferably, a length of a gate is determined by the certain gradient of the second ion implanting process.

Preferably, removing the oxide film is implemented by wet etch.

According to another embodiment of the present invention, a method of fabricating a semiconductor memory apparatus comprises: determining a length of a gate surrounding a channel region of a vertical transistor; and implanting an impurity into a semiconductor substrate to form a bit line, after determining the length of the gate.

Preferably, determining the length of the gate comprises: depositing a conductive layer surrounding the channel region; changing a feature of some portion of the conductive layer through an ion implanting process to form an oxide film; and removing the oxide film using an etching selectivity difference.

Preferably, the conductive layer is TiN and the oxide film is TiON.

Preferably, the channel region is a pattern formed in a pillar shape by etching some portion of the semiconductor substrate.

Preferably, the ion implanting process comprises: a first ion implanting process for implanting oxygen ions vertically; and a second ion implanting process for implanting the oxygen ions, rotating with a certain gradient.

Preferably, removing the oxide film is implemented by wet etch.

Preferably, the method of fabricating the semiconductor memory apparatus further comprises depositing an oxide film on the channel region and the gate, prior to forming the bit line.

DESCRIPTION OF EMBODIMENTS

Hereinafter, embodiments of the present invention will be described in detail with reference to the accompanying drawings.

FIGS. 1a to 1f are sectional diagrams for explaining a method of fabricating a semiconductor apparatus including a vertical transistor according to an embodiment of the present invention. Particularly, a case where the vertical transistor is used as a cell transistor included in each unit cell in a semiconductor memory apparatus will be explained as an example.

Figure 1A:
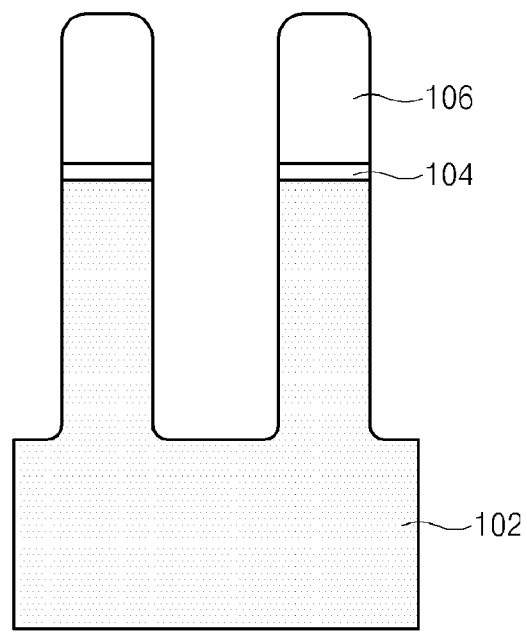
FIGS. 1a to 1f are sectional diagrams for explaining a method of fabricating a semiconductor apparatus including a vertical transistor according to an embodiment of the present invention.

Referring to FIG. 1a, so as to form the vertical transistor, a pad oxide film 104 is formed on a semiconductor substrate 102 and a hard mask nitride film 106 is deposited on the pad oxide film 104. Next, the hard mask nitride film 106 is patterned through an exposure process using a mask defining a channel region of the vertical transistor. In addition, the pad oxide film 104 and the semiconductor substrate 102 are etched using the patterned hard mask nitride film 106, to thereby form a pillar-shaped channel region.

Figure 1B:
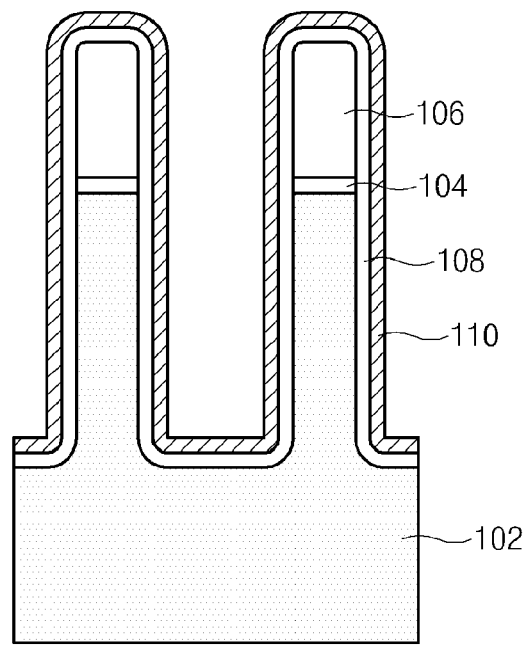

Referring to FIG. 1b, a gate oxide film 108 and a conductive layer 110, which is a gate electrode material, are sequentially deposited on the entire surface of the structure on the semiconductor substrate 102. For example, the conductive layer 110 may be TiN.

Figure 1C:
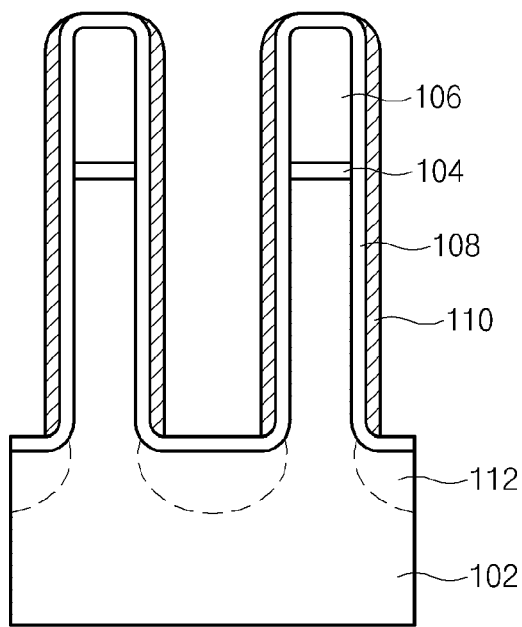

Referring to FIG. 1c, the horizontal sections of the conductive layer 110 deposited on the hard mask nitride film 106 and between the pillar-shaped channel regions on the semiconductor substrate 102 is removed through an etch-back process or the like. It is similar to a process for forming a spacer on a sidewall of a gate pattern included in a general semiconductor memory apparatus. Thereafter, an impurity is implanted into the semiconductor substrate 102 exposed between the pillar-shaped channel regions through an ion implanting process, to thereby form a buried bit line 112.

Figure 1D:
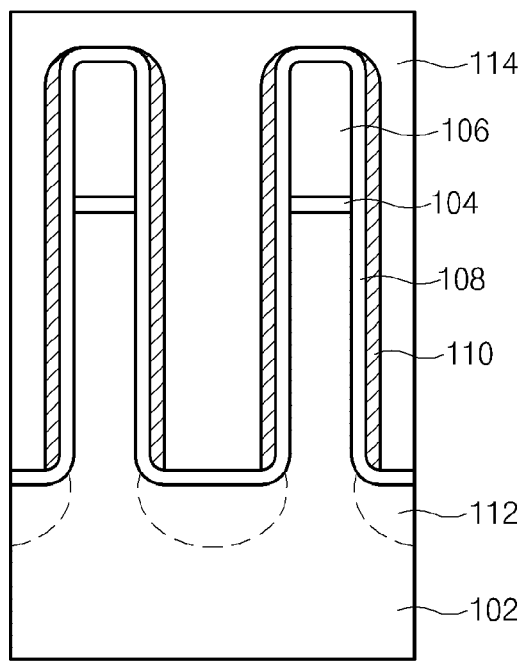

As illustrated in FIG. 1d, an insulating material is deposited sufficiently high to cover the structure formed on the semiconductor substrate 102, and planarized through a Chemical Mechanical Polishing (CMP) process to an appropriate height, thereby forming an interlayer insulating film 114.

Figure 1E:
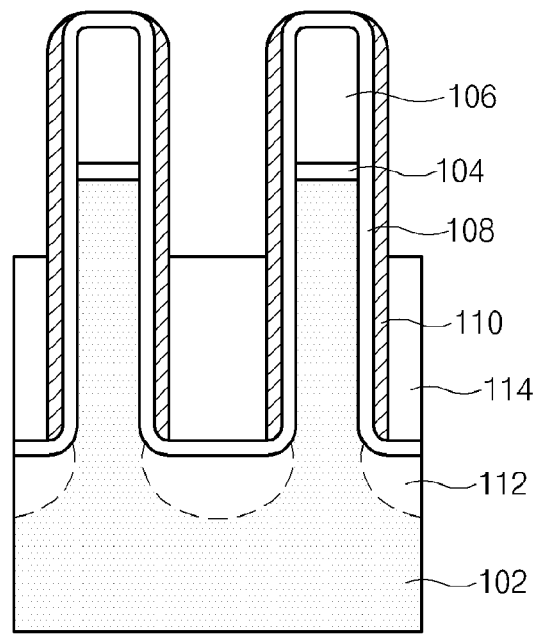

Referring to FIG. 1e, an upper portion of the interlayer insulating film 114 is removed through an etch-back process using a dry etch process to expose some portion of the conductive layer 110. Here, the etch is performed such that the surface of the interlayer insulating film 114 is lower than the height of the pad oxide film 104 and some portion of the conductive layer 110 surrounding the pillar-shaped channel region is exposed. At this time, a final gate length of the vertical transistor is determined according to a depth of the interlayer insulating film 114 removed.

Figure 1F:
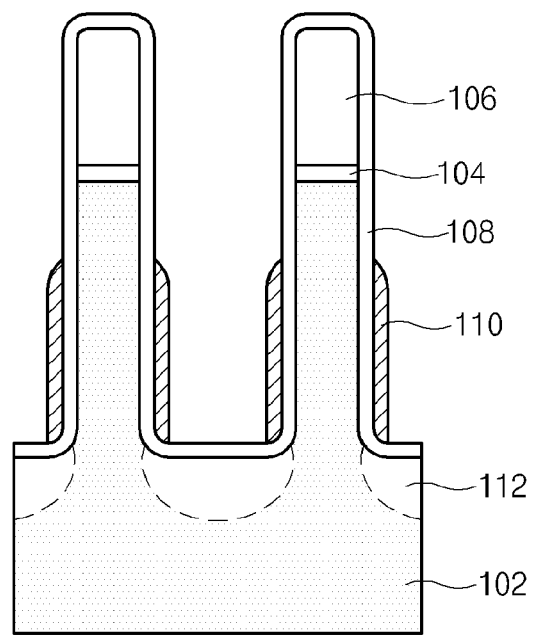

Referring to FIG. 1f, the conductive layer 110 exposed by the etch-back process is removed, and then the remaining interlayer insulating film 114 is removed. The remaining conductive layer 110 which has not been etched due to the interlayer insulating film 114 is used as the gate of the vertical transistor.

Hereinafter, problems that may occur in fabricating the vertical transistor according to the foregoing embodiment will be explained.

During the etch-back process for etching the upper portion of the interlayer insulating film 114 as explained with reference to FIG. 1e, not only the interlayer insulating film 114 is removed but also the hard mask nitride film 106 formed on the pillar-shaped channel region is damaged. Particularly, since the etch-back process for etching the upper portion of the interlayer insulating film 114 as explained with reference to FIG. 1e is implemented by dry etch, the damage of the hard mask nitride film 106 may be maximized.

Beforehand, in the etch-back process for forming the buried bit line 112 as explained with reference to FIG. 1c, some portion of the hard mask nitride film 106 serving as an etch barrier film has already been damaged.

Moreover, although not illustrated, the hard mask nitride film 106 should function as the etch barrier film in a succeeding process for forming a word line. However, if a large volume of hard mask nitride film 106 has already been damaged after the etch-back process of FIG. 1e, before forming the word line, the pillar-shaped channel region may be damaged in the succeeding process for forming the word line. If any portion of the pillar-shaped channel region is damaged, a problem occurs at a location between one side of a source and a drain of the vertical transistor, which increases a leakage current.

In order to solve the foregoing problem, the hard mask nitride film 106 may be deposited and patterned sufficiently thick to compensate for a portion damaged in the succeeding processes. However, if the thickness of the hard mask nitride film 106 is large, when the pillar-shaped channel region and the hard mask nitride film 106 are combined, the pattern may collapse due to a high aspect ratio. Therefore, there is a limitation in increasing the thickness of the hard mask nitride film 106.

As another method for solving the problem, the etch-back process for etching the upper portion of the interlayer insulating film 114 as explained with reference to FIG. 1e can be done by wet etch so as to reduce damage of the hard mask nitride film 106. However, when the etch-back process is implemented by the wet etch, since it is difficult to control a consistent etch depth of the interlayer insulating film 114, the exposed area of the conductive layer 110 surrounding each pillar-shaped channel region may be different. In this case, since the plurality of transistors will have a different gate length, this method is not preferable for forming the vertical transistor as a plurality of cell transistors requires a uniform operating characteristic.

The present invention forms the gate through the ion implanting process and the wet etch instead of the dry etch so as to solve the problems occurring in the process for forming the pillar-shaped vertical transistor to fabricate the high integrated semiconductor apparatus. Hereinafter, an embodiment of the present invention will be described in detail with reference to the accompanying drawings.

FIGS. 2a to 2g are sectional diagrams for explaining a method of fabricating a semiconductor apparatus including a vertical transistor according to another embodiment of the present invention.

Figure 2A:
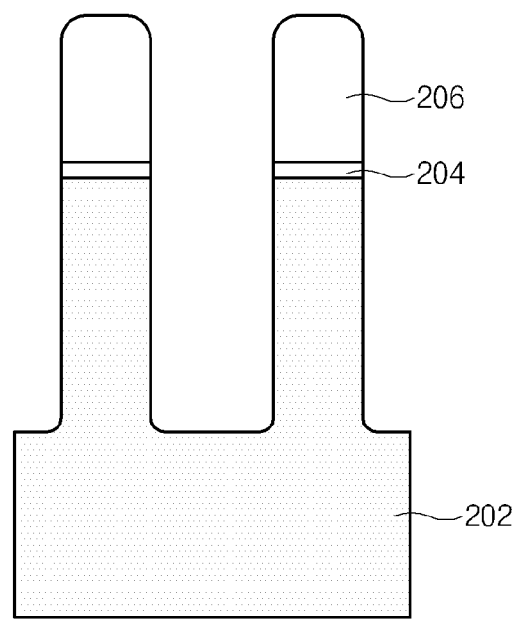
FIGS. 2a to 2g are sectional diagrams for explaining a method of fabricating a semiconductor apparatus including a vertical transistor according to another embodiment of the present invention.

Referring to FIG. 2a, so as to form the vertical transistor, a pad oxide film 204 is formed on a semiconductor substrate 202 formed of silicon, and a hard mask film 206, e.g., a nitride film, is deposited on the pad oxide film 204. Next, the hard mask film 206 is patterned through an exposure process using a mask defining a channel region of the vertical transistor. In addition, the pad oxide film 204 and the semiconductor substrate 202 are etched using the patterned hard mask film 206, to thereby form a pillar-shaped channel region.

Figure 2B:
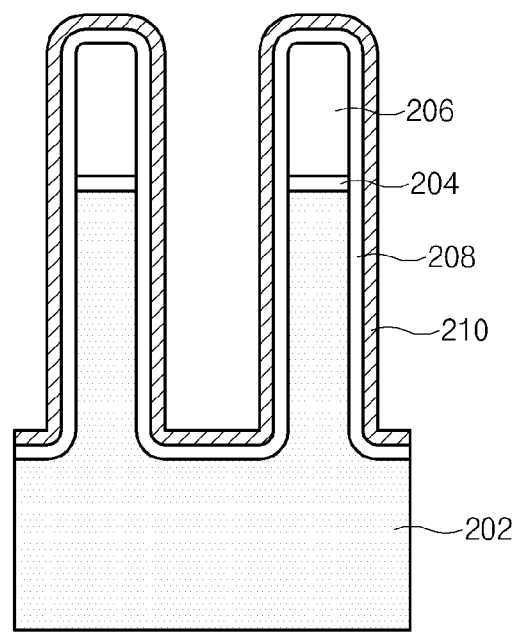

Referring to FIG. 2b, a gate oxide film 208 and a conductive layer 210, which is a gate electrode material, are sequentially deposited on the entire surface of the structure on the semiconductor substrate 202. For example, the conductive layer 210 may be TiN.

Figure 2C:
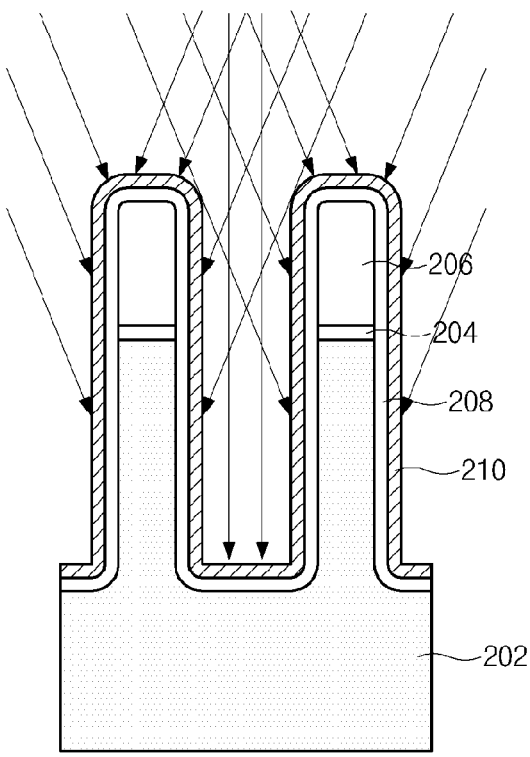

Referring to FIG. 2c, a feature of some portion of the conductive layer 210 is changed through an ion implanting process. Here, the ion implanting process includes a first ion implanting process for implanting oxygen ions vertically, and a second ion implanting process for implanting the oxygen ions, at different angles. The first ion implanting process serves to remove the conductive layer 210 deposited between the pillar-shaped channel regions to separate gates connected between the neighboring channel regions, and to form a bit line below the channel region. The second ion implanting process serves to determine a length of the gate surrounding each channel region.

Figure 2D:
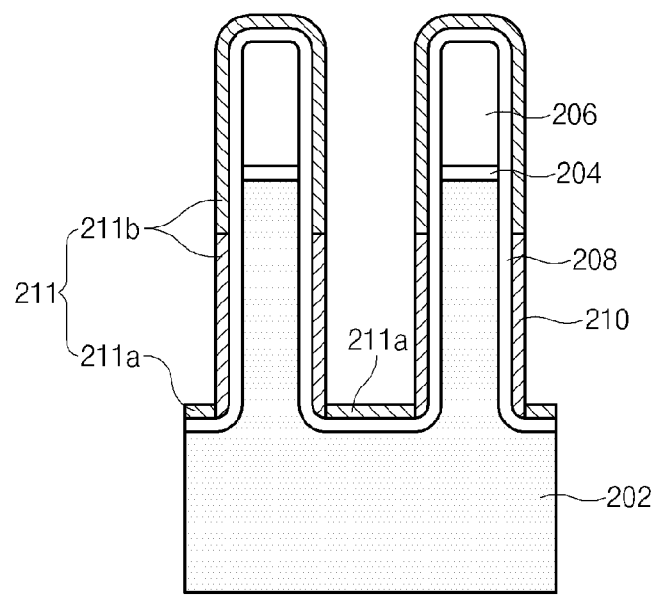

Referring to FIG. 2d, portions of the conductive layer 210 is changed into a first oxide film 211a and a second oxide film 211b due to the ion implanting process. If the conductive layer 210 is formed of TiN, the oxide films 211a and 211b become TiON. The aforementioned ion implanting process not only implants the oxygen ions vertically but also implants the oxygen ions at different angles. Therefore, a first portion of the conductive layer 210 deposited between the pillar-shaped channel regions and a second portion over a certain height of the pillar-shaped channel regions are converted to the first and second oxide films 211a and 211b, respectively. The conductive layer 210 provided between the first and second oxide films remain conductive since they did not receive a significant amount of oxygen ions.

Particularly, since the ion implanting process implants the oxygen ions, rotating at 90° with a certain gradient, it is possible to evenly implant the ions into the conductive layer 210 surrounding the pillar-shaped channel region. Accordingly, as compared with the prior art controlling the etched degree through the etch-back process, the present invention can uniformly and precisely determine the gate length of the vertical transistor.

Figure 2E:
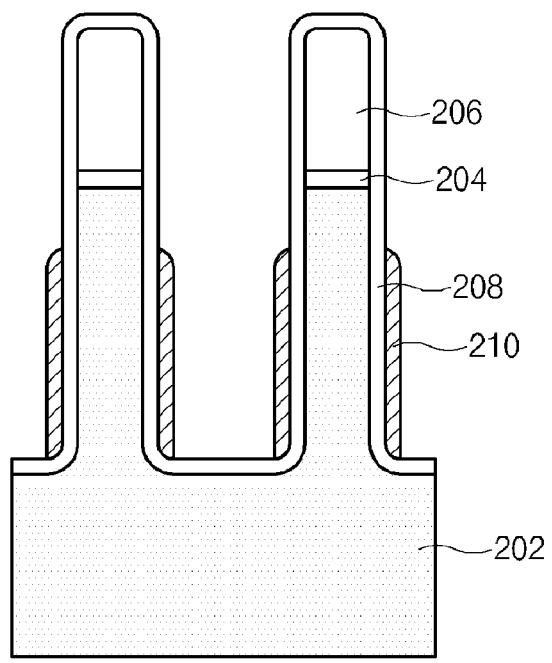

As illustrated in FIG. 2e, the first and second oxide films 211a and 211b are removed through wet etch, using an etching selectivity difference between the conductive layer 210 and the oxide film 211. Here, the remaining conductive layer 210 becomes the gate of the vertical transistor.

Differently from the method associated with FIGS. 1a-1f, the present embodiment changes film quality of portions of the conductive layer through the ion implanting process and selectively removes those portions through wet etch. In this case, since it is possible to reduce damage of the hard mask film 206 protecting the pillar-shaped channel region, the pillar-shaped channel region can be prevented from being damaged by an etching process for forming a word line after forming the gate.

Figure 2F:
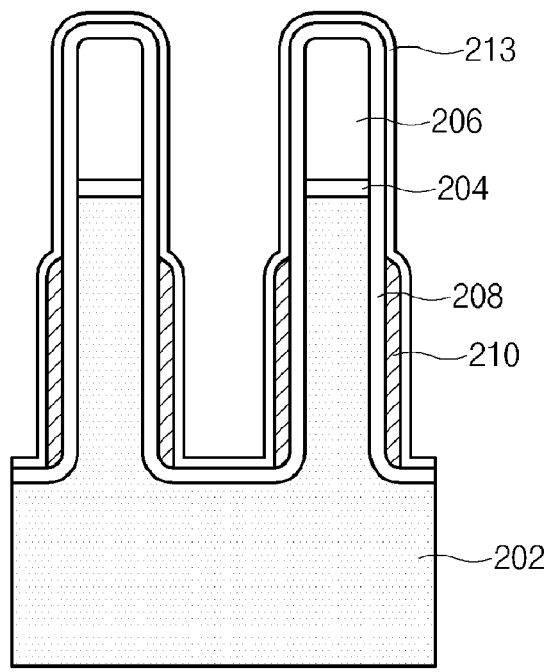

Referring to FIG. 2f, a buffer oxide film 213 is additionally deposited on the pillar-shaped channel region and the conductive layer 210 used as the gate. Here, the buffer oxide film 213 is deposited to undo the damage that may occur in the gate oxide film 208, when the oxide film 211 is removed by wet etch. In addition, the buffer oxide film 213 can protect the pillar-shaped channel region from a process for implanting an impurity in a succeeding process for forming a bit line.

Figure 2G:
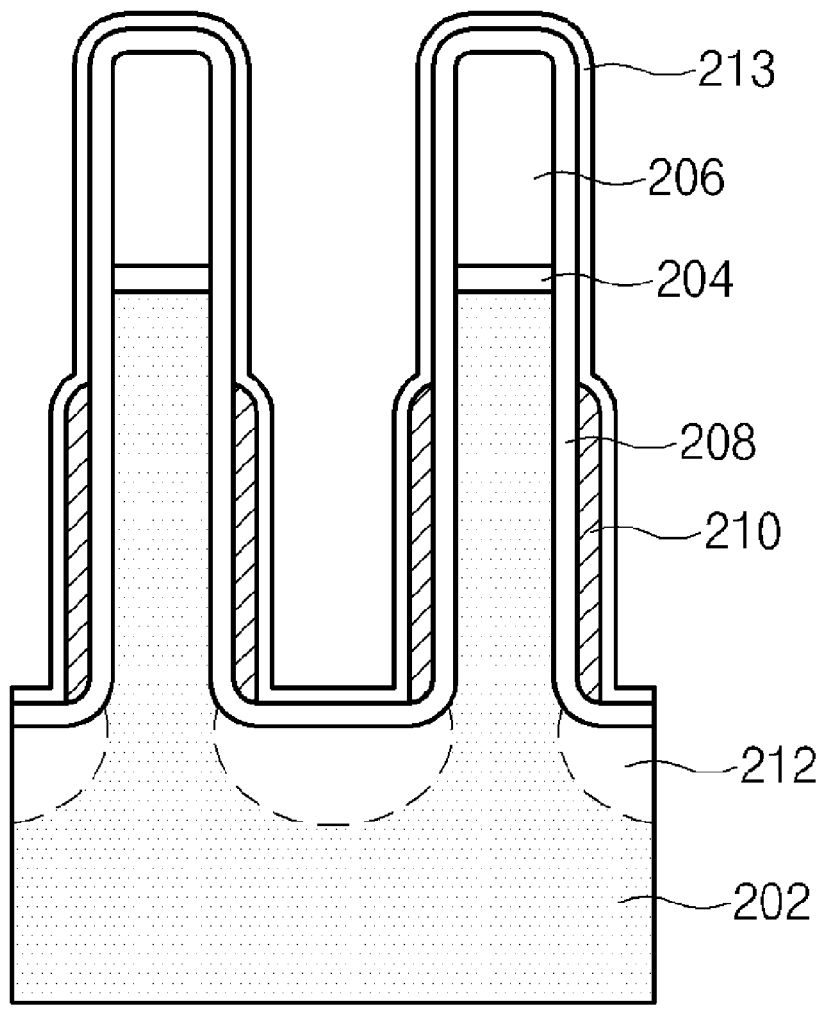

Referring to FIG. 2g, an impurity is implanted into the semiconductor substrate 202 exposed between the pillar-shaped channel regions through an ion implanting process, to thereby form a buried bit line 212. While the prior art forms the buried bit line before completing the gate of the vertical transistor, the present invention implants the impurity to form the bit line 212 after determining the length of the gate.

As set forth herein, in the first embodiment the channel region is damaged in forming the word line due to the dry etch performed in forming the gate of the conventional vertical transistor. The method of fabricating the semiconductor apparatus according to the present invention forms the gate through the ion implanting process and the wet etch, thereby preventing the channel region from being damaged in the succeeding process.

Accordingly, it is not necessary to deposit the hard mask film 206 thick to protect the pillar-shaped channel region, and it is possible to prevent the pillar-shaped pattern from falling due to a high aspect ratio. Moreover, according to the present invention, the size of the gate of the vertical transistor is determined adjusting the gradient angle of implanting the ions in the ion implanting process. Therefore, when cell transistors are formed using the plurality of vertical transistors, the respective vertical transistors can have a uniform operating characteristic.

The above embodiments of the present invention are illustrative and not limitative. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A method of fabricating a semiconductor apparatus, comprising:

forming first and second pillars on a semiconductor substrate;

depositing a conductive layer over the first and second pillar and the substrate, the conductive layer enclosing the first and second pillars, the conductive layer having a first portion provided between the first and second pillars, a second portion provided at an upper part of the first and second pillars, and a third portion provided between the first and second portion of the conductive layer;

implanting ions into the first portion of the conductive layer and the second portion of the conductive without implanting a significant amount of ions into the third portion, wherein the first and second portions of the conductive layers are converted to another material having a different characteristic than the conductive layer while the third portion of the conductive layer is not converted to another material; and removing the converted first and second portions without removing the third portion using an etch selectivity between the first and second portions and the third portion.

2. The method according to claim 1, further comprising:
implanting an impurity into a portion of the semiconductor substrate exposed between the first and second pillars as a result of removing the first portion in order to form a bit line.

3. The method according to claim 2, wherein the ions implanted to the first and second portions of the conductive layers are oxygen ions, the method further comprising:

depositing an oxide film over the first and second pillars and the third portion of the conductive layer prior to forming the bit line.

4. The method according to claim 1, wherein forming the first and second pillars on the semiconductor substrate comprises:

forming a pad oxide film on the semiconductor substrate;
forming a hard mask film on the pad oxide film;
patterning the hard mask film; and
etching the pad oxide film and a portion of the semiconductor substrate using the patterned hard mask film.

5. The method according to claim 1, further comprising:
forming a gate dielectric film over the first and second pillars prior to depositing the conductive layer.

6. The method according to claim 1, wherein the ion implanting process comprises:
   a first ion implanting process for implanting first ions vertically, so that the first ions are implanted predominately at the first portion of the conductive layer; and
   a second ion implanting process for implanting second ions at an angle, so that the second ions are implanted predominately at the second portion of the conductive layer.

7. The method according to claim 6, wherein the first and second pillars are used to define first and second gates, respectively, where lengths of the first and second gates are controlled by controlling an implantation angle associated with the second ion implantation process.

8. The method according to claim 1, wherein the first and second portion of the conductive layer are converted to oxide as a result of implanting the ions into the first and second portions of the conductive layer, the converted first and second portion being removed by a wet etch process.

9. A method of fabricating a semiconductor memory apparatus, the method comprising:
   providing a semiconductor substrate including a pillar for forming a gate, the pillar being the same material as the semiconductor substrate;
   forming a gate dielectric layer over the pillar;
   forming a conductive layer over the gate dielectric layer and the semiconductor substrate, the conductive layer including a first portion provided adjacent to a lower portion of the pillar, a second portion provided against an upper portion of the pillar, and a third portion provided against the lower portion of the pillar;
   implanting first ions predominately into the first portion of the conductive layer and converting the first portion of the conductive layer to a first converted material;
   implanting second ions predominately into the second portion of the conductive layer and converting the second portion of the conductive layer into a second converted material; and
   removing the first and second converted material while leaving the third portion of the conductive layer against the pillar, the third portion of the conductive layer not being converted to another material.

10. The method according to claim 9, wherein the first and second converted materials have a different etch selectivity than the conductive layer, the first and second converted material being removed using a wet etch process.

11. The method according to claim 10, wherein the conductive layer is TiN and the first converted material is TiON.

12. The method according to claim 10, wherein the pillar is formed by etching the semiconductor substrate, wherein the second converted material is TiON.

13. The method according to claim 10, wherein the first ions and the second ions are both oxygen ions, wherein the first ions are implanted vertically, and the second ions are implanted at an angle that would direct the second ions to the second portion of the conductive layer.

14. The method according to claim 10, wherein the first and second converted materials are removed by a wet etch process.

15. The method according to claim 9, further comprising:
forming an oxide film over the third portion of the conductive layer and the pillar after the first and second converted materials have been removed.

* * * * *